(12) United States Patent
Yamamori et al.

(10) Patent No.: US 11,465,185 B2
(45) Date of Patent: Oct. 11, 2022

(54) LIGHT IRRADIATION DEVICE

(71) Applicant: Ushio Denki Kabushiki Kaisha, Tokyo (JP)

(72) Inventors: Kenji Yamamori, Tokyo (JP); Kiyoto Omata, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 387 days.

(21) Appl. No.: 16/629,397

(22) PCT Filed: Jul. 10, 2018

(86) PCT No.: PCT/JP2018/025948
§ 371 (c)(1),
(2) Date: Jan. 8, 2020

(87) PCT Pub. No.: WO2019/017234
PCT Pub. Date: Jan. 24, 2019

(65) Prior Publication Data
US 2020/0147657 A1    May 14, 2020

(30) Foreign Application Priority Data
Jul. 19, 2017    (JP) .............................. JP2017-139901

(51) Int. Cl.
*G21K 5/00*    (2006.01)
*B08B 7/00*    (2006.01)
(Continued)

(52) U.S. Cl.
CPC .............. *B08B 7/0057* (2013.01); *G21K 5/00* (2013.01); *H01J 65/04* (2013.01); *H01L 21/304* (2013.01); *H01L 21/67115* (2013.01)

(58) Field of Classification Search
CPC ..... B08B 7/0057; B08B 7/0035; B08B 11/02; B08B 11/04; G21K 5/00; H01J 65/04;
(Continued)

(56) References Cited

U.S. PATENT DOCUMENTS 5,669,979 A * 9/1997 Elliott ............... H01L 21/02052
134/1

FOREIGN PATENT DOCUMENTS

JP    2006-147928 A    6/2006
JP    2006147928 A *    6/2006
(Continued)

OTHER PUBLICATIONS

International Search Report issued in PCT/JP2018/025948; dated Sep. 25, 2018.
(Continued)

*Primary Examiner* — Michael Maskell
(74) *Attorney, Agent, or Firm* — Studebaker & Brackett PC

(57) ABSTRACT

The present invention has as an object the provision of a light irradiation device capable of performing optical cleaning with high stability regardless of the transport speed of a workpiece. The light irradiation device of the present invention emits ultraviolet light to one surface of a band-shaped workpiece transported along a transport path, and includes a lamp house having an opening along a passing plane on a side of the one surface of the workpiece in the transport path, an ultraviolet lamp provided in the lamp house so as to extend in a width direction of the workpiece, gas supplier configured to supply a treatment-space gas into the lamp house, and an exhaust space forming member having an opening along a passing plane on a side of the other surface of the workpiece in the transport path. The treatment-space gas is produced by mixing a gas containing oxygen and/or
(Continued)

water with an inert gas serving as a principal component, and a shielding body for forming a gas circulation resistance bottleneck between the shielding body and each edge part of the workpiece is provided in the opening of the lamp house.

6 Claims, 9 Drawing Sheets

(51) Int. Cl.
  *H01J 65/04* (2006.01)
  *H01L 21/304* (2006.01)
  *H01L 21/67* (2006.01)
(58) Field of Classification Search
  CPC ............. H01L 21/304; H01L 21/67115; H01L 21/67028; H01L 21/6776
  USPC .............................. 250/428, 432 R, 435, 436
  See application file for complete search history.

(56) References Cited

FOREIGN PATENT DOCUMENTS

| | | | | |
|---|---|---|---|---|
| JP | 2008-043925 A | | 2/2008 | |
| JP | 2008043925 A | * | 2/2008 | ........... B08B 7/0057 |

OTHER PUBLICATIONS

English tranlation HIROSE JP2006-147928A, total 20 pages, retrieved from the internet https://patents.google.com/patent/JP2006147928A/en?oq=2006-147928 (Year: 2006).

An Office Action; "Notice of Reasons for Refusal", mailed by the Japanese Patent Office dated Jun. 29, 2021, which corresponds to Japanese Patent Application No. 2017-139901 and is related to U.S. Appl. No. 16/629,397; with English language translation.

* cited by examiner

LIGHT IRRADIATION DEVICE

TECHNICAL FIELD

The present invention relates to a light irradiation device that emits ultraviolet light to one surface of a band-shaped workpiece transported along a transport path.

BACKGROUND ART

Ultraviolet light irradiation methods have been known as a light asking treatment to a resist in a manufacturing process for a semiconductor, liquid crystal, or the like, treatments for removing a resist attached to a patterning surface of a template in a nanoimprint device or dry cleaning a glass substrate for liquid crystal, a silicon wafer, or the like, and a treatment for improving surface quality by washing a bonded surface of a sheet-like film wound in a roll.

As such a light irradiation device that emits ultraviolet light, Patent Literature 1, for example, discloses a light irradiation device that emits vacuum ultraviolet light to a workpiece to remove contaminants on the front surface of the workpiece by cleaning effects of the vacuum ultraviolet light and ozone or hydroxyl radicals generated by such vacuum ultraviolet light.

FIG. 18 is a cross-sectional view schematically showing an example of a conventional light irradiation device in the transport direction of a workpiece.

In this light irradiation device, inside a lamp house 52 formed by a base member 53 in which a light irradiation port 53A is opened and an outer cover 54 in the overall shape of a rectangular box, which is disposed on an upper side (the upper side in FIG. 18) of the base member 53 so as to cover the light irradiation port 53A, a plurality of excimer lamps 51 are provided extending parallel to one another on a plane parallel to the light irradiation port 53A. A workpiece W is carried into the light irradiation device by transporter 58, such as a roller conveyor, along a transport path, and ultraviolet light from the excimer lamps 51 is emitted to one surface (the upper surface in FIG. 18) of the workpiece W in a treatment region directly below the light irradiation port 53A of the lamp house 52 where the workpiece W is irradiated with ultraviolet light.

Vacuum ultraviolet light has a property of being attenuated significantly by being absorbed by oxygen in the atmosphere. Thus, in such a light irradiation device in the conventional techniques, the attenuation of vacuum ultraviolet light is prevented by externally supplying an inert gas, such as a nitrogen gas, into an ultraviolet radiation space between the excimer lamps 51 and the workpiece W to remove excessive oxygen more than required for cleaning in the ultraviolet radiation space. Such an inert gas is discharged, for example, from gas supply ports 56H of gas supply pipes 56 provided on a rear side (the upper side in FIG. 18) of the excimer lamps 51 in the lamp house 52 to replace air inside the ultraviolet radiation space with an inert gas atmosphere.

Note that reference numeral 59 in FIG. 18 denotes a cooling block including pipes 59A through which a cooling fluid flows.

As mentioned above, an inert gas is externally supplied into the ultraviolet radiation space between the excimer lamps 51 and the workpiece W to remove excessive oxygen more than required for cleaning in the ultraviolet radiation space. It has been known that the irradiation of vacuum ultraviolet light in the atmosphere having an extremely low oxygen concentration, on the other hand, results in an extremely low ozone yield, and thus activating action caused by ozone fails to work well on the front surface of the workpiece, thereby deteriorating the effect of optical cleaning conversely.

Also when vacuum ultraviolet light is irradiated in the atmosphere having an extremely low humidity, which is caused by excessively replacing the air inside the ultraviolet radiation space with dry inert gas, a yield of active species such as hydroxyl radicals becomes extremely low, thereby deteriorating the effect of cleaning the front surface of the workpiece.

To solve such a problem, a gas produced by mixing water with an inert gas is supplied into the ultraviolet radiation space in the light irradiation device described in Patent Literature 1, for example.

Specifically, dry nitrogen gas is supplied to a humidifier from a nitrogen gas supply source comprising a gas cylinder or the like. Humidified nitrogen gas having an absolute humidity adjusted to a predetermined range is generated in the humidifier, and the humidified nitrogen gas is supplied into the ultraviolet radiation space through the gas supply ports 56H of the gas supply pipes 56.

CITATION LIST

Patent Literature

Patent Literature 1: Japanese Patent Application Laid-Open No. 2008-43925

SUMMARY OF INVENTION

Technical Problem

On the other hand, the workpiece basically has a band shape in the light irradiation device, and workpieces having various shapes and materials, such as a plate-shaped workpiece or a sheet-like film, in particular, are subjected to an optical cleaning treatment. The transport speed of the workpiece to the treatment region, e.g., the speed of feeding a sheet-like film, is determined on the basis of the shape and material of the workpiece, the state of the front surface of the workpiece, and the like. Thus, the transport speed varies for each of workpieces.

Since an amount of air introduced into the surroundings of the treatment region (ultraviolet radiation space) along with the transport of the workpiece depends on the transport speed of the workpiece, variations occur in oxygen concentration or humidity in the ultraviolet radiation space among workpieces, thus causing a problem of being unable to obtain a desired optical cleaning effect stably.

The present invention has been made in view of the foregoing circumstances and has as its object the provision of a light irradiation device capable of performing optical cleaning and improving surface quality with high stability regardless of the transport speed of a workpiece.

Solution to Problem

The present invention provides a light irradiation device configured to emit ultraviolet light to one surface of a band-shaped workpiece transported along a transport path, comprising:

a lamp house having an opening along a passing plane on a side of the one surface of the workpiece in the transport path;

an ultraviolet lamp provided in the lamp house so as to extend in a width direction of the workpiece;

gas supplier configured to supply a treatment-space gas into the lamp house; and an exhaust space forming member having an opening along a passing plane on a side of the other surface of the workpiece in the transport path, wherein the treatment-space gas is produced by mixing a gas containing oxygen and/or water with an inert gas serving as a principal component, and a shielding body for forming a gas circulation resistance bottleneck between the shielding body and each edge part of the workpiece is provided in the opening of the lamp house.

In the light irradiation device of the present invention, an oxygen concentration in the treatment-space gas may preferably be 1 to 5% by volume.

In the light irradiation device of the present invention, a gas discharge port may preferably be provided in the exhaust space forming member, and an exhaust amount from the gas discharge port may preferably be greater than a supply amount of the treatment-space gas supplied from the gas supplier.

In the light irradiation device of the present invention, a relative humidity in the lamp house into which the treatment-space gas has been supplied may preferably be 18 to 30% RH.

The light irradiation device of the present invention may be configured to include a humidifier for mixing water with the inert gas.

In the light irradiation device of the present invention, the shielding body may be configured to include a plate-shaped frame part extending continuously with a periphery of the opening of the lamp house along a transport plane of the workpiece and having an opening with a width allowing for passage of the workpiece.

The light irradiation device of the present invention may include a plate-shaped frame part extending continuously with a periphery of the opening of the lamp house along the transport plane of the workpiece and having an opening with a width allowing for passage of the workpiece, the shielding body may include a shielding member having a base end part and a leading end part formed continuously in a crank shape, and the shielding member may be disposed in such a manner that the base end part is bonded to a lower surface side of the frame part of the lamp house and the leading end part protrudes so as to cover the other surface of each edge part of the workpiece in a width direction thereof, without being in contact therewith.

The light irradiation device of the present invention may include a plate-shaped frame part extending continuously with a periphery of the opening of the lamp house along the transport plane of the workpiece and having an opening with a width allowing for passage of the workpiece, the shielding body may include a plate-shaped shielding member, and the shielding member may be disposed so as to cover a lower surface of each edge part of the frame part of the lamp house extending in the transport direction of the workpiece and the other surface of each edge part of the workpiece in a width direction thereof, without being in contact therewith.

In the light irradiation device of the present invention, the shielding body may include a plate-shaped frame part extending continuously with a periphery of the opening of the lamp house along a parallel plane at a level position more on the side of the other surface of the workpiece than the transport plane of the workpiece, and an edge part of the frame part extending in the transport direction of the workpiece may protrude so as to cover the other surface of each edge part of the workpiece in a width direction thereof, without being in contact therewith.

The light irradiation device of the present invention may include a plate-shaped frame part extending continuously with a periphery of the opening of the lamp house along the transport plane of the workpiece and having an opening with a width allowing for passage of the workpiece, the shielding body may include a plate-shaped shielding member, and the shielding member may be disposed so as to cover a lower surface of each edge part of the frame part of the lamp house extending in the transport direction of the workpiece and the entire other surface of the workpiece, without being in contact therewith.

In the light irradiation device of the present invention, the shielding body may be provided so that each edge part of the shielding body extending in the transport direction of the workpiece can change the position thereof in the width direction of the workpiece.

Advantageous Effects of Invention

In the light irradiation device of the present invention, an oxygen concentration and/or a humidity in an ultraviolet radiation space can be stably adjusted to a desired range by supplying the treatment-space gas, which is produced by mixing a gas containing oxygen and/or water with an inert gas serving as a principal component, into the lamp house regardless of the transport speed of the workpiece determined on the basis of its type and shape. Consequently, the oxygen concentration and/or the humidity in the ultraviolet radiation space can be prevented from varying. Thus, oxygen and/or water is actively supplied into the ultraviolet radiation space while stably preventing the attenuation of ultraviolet light in the ultraviolet radiation space. As a result, optical cleaning can be performed and surface quality can be improved with high stability.

DESCRIPTION OF EMBODIMENTS

Hereinafter, embodiments of the present invention will be described.

First Embodiment

Figure 1:
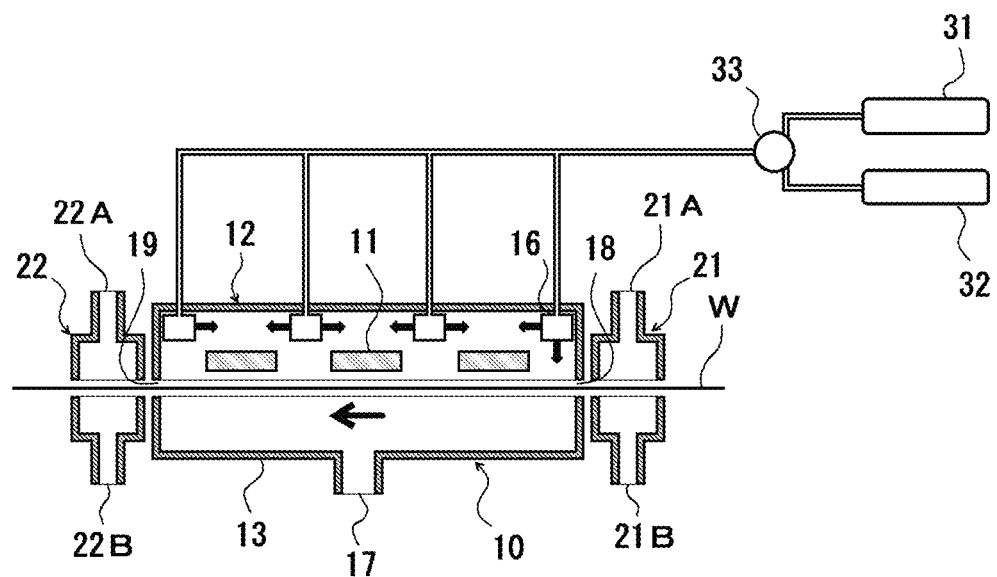
FIG. 1 is a schematic view of a light irradiation device according to a first embodiment of the present invention, including its cross-section in the transport direction of a workpiece.
Figure 2:
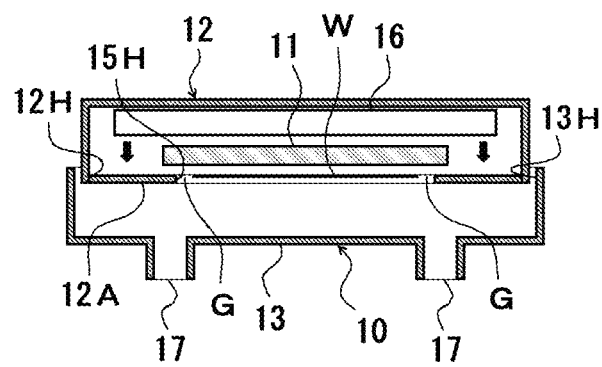
FIG. 2 is a cross-sectional view of the light irradiation device of FIG. 1 in the width direction of the workpiece.
Figure 3:
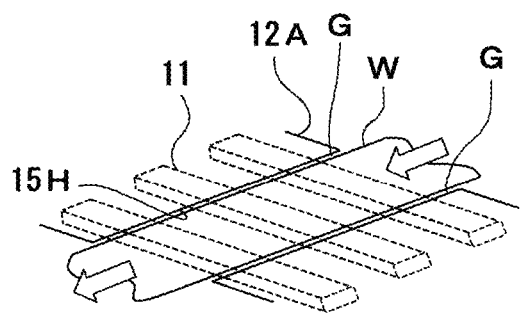
FIG. 3 is a perspective view as seen from an exhaust space side, which schematically explains a main part of the light irradiation device of FIG. 1.

FIG. 1 is a schematic view of a light irradiation device according to a first embodiment of the present invention, including its cross-section in the transport direction of a workpiece. FIG. 2 is a cross-sectional view of the light irradiation device of FIG. 1 in the width direction of the workpiece. FIG. 3 is a perspective view as seen from the exhaust space side, which schematically explains a main part of the light irradiation device of FIG. 1.

The light irradiation device of the present invention performs optical cleaning on one surface (the upper surface in FIG. 1) of a band-shaped workpiece W transported, along a transport path, from a carry-in port 18 located on the upstream side (the right side in FIG. 1) of a treatment chamber 10 by emitting ultraviolet light thereto in the treatment region in which ultraviolet light from an ultraviolet lamp 11 is irradiated. The light irradiation device thereby improves the surface quality of the workpiece W.

As examples of the band-shaped workpiece (work piece) W to which ultraviolet light is emitted in the light irradiation device, may be mentioned plate-shaped bodies, such as glass substrates and printed circuit boards, and films in the form of continuous sheets.

The workpiece W has a width of about 100 to 2000 mm, for example.

The treatment chamber 10 is formed by: a housing-like lamp house 12 having an opening 12H along a passing plane on the side of the one surface (the upper surface side in FIG. 1) of the workpiece W in the treatment region of the transport path; and a housing-like exhaust space forming member 13 having an opening 13H along a passing plane on the side of the other surface (the lower surface side in FIG. 1) of the workpiece W in the treatment region. Such a configuration divides the interior of the treatment chamber 10 into a treatment space formed by the interior of the lamp house 12 and an exhaust space formed by the interior of the exhaust space forming member 13 with the treatment region of the transport path interposed therebetween. At both ends of the transport path, the treatment chamber 10 is provided with the carry-in port 18 in the form of a slit and a carry-out port 19 in the form of a slit, which are formed by the lamp house 12 and the exhaust space forming member 13.

It is preferable in the light irradiation device that a shielding body forming a gas circulation resistance bottleneck G between the shielding body and each edge part of the workpiece W in its width direction is provided in the opening 12H of the lamp house 12. Specifically, the shielding body is formed by a plate-shaped frame part 12A extending continuously with the periphery of the opening 12H of the lamp house 12 along a transport plane of the workpiece W and having an opening 15H with a width allowing for the passage of the workpiece W. Such a configuration creates, in the opening 15H of the frame part 12A, the gas circulation resistance bottleneck G between an edge of the shielding body extending parallel to the transport direction of the workpiece W and an edge of the workpiece W in its width direction. The frame part 12A of the lamp house 12 is positioned at the same level as the treatment region for the workpiece W.

A distance (gap) of the gas circulation resistance bottleneck G may preferably have a dimension causing a pressure in the exhaust space forming member 13 to be lower than a pressure in the lamp house 12 and allowing the pressure states in these spaces to be maintained. Specifically, it is preferable that a difference between the pressure in the lamp house 12 and the pressure in the exhaust space forming member 13 is maintained to be not lower than 1 Pa, for example. Such a pressure difference increases as the distance of the gas circulation resistance bottleneck G decreases.

The provision of the shielding body, forming the gas circulation resistance bottleneck G between the shielding body and each edge part of the workpiece W in its width direction, in the opening 12H of the lamp house 12 in the light irradiation device disturbs free gas circulation between the space in the lamp house 12 and the space in the exhaust space forming member 13. Such disturbance increases resistance against gas circulation, and thereby enhances airtightness in the lamp house 12. Thus, regardless of the transport speed of the workpiece W determined on the basis of its type and shape, the atmosphere in the ultraviolet radiation space can be replaced with the treatment-space gas using a smaller amount of the treatment-space gas in comparison with the conventional techniques.

In the lamp house 12, a plurality of ultraviolet lamps 11 extending in the width direction of the workpiece W are provided in the same plane so as to be spaced apart from one another in the transport direction of the workpiece W, and gas supplier configured to supply the treatment-space gas into the lamp house 12 is provided on a rear surface side (the upper side in FIG. 1) of the ultraviolet lamp 11.

A flat xenon excimer lamp having a cross-section extending in the transport direction of the workpiece W, which radiates vacuum ultraviolet light having a center wavelength of about 172 to 380 nm, for example, is used as the ultraviolet lamp 11.

Specifically, the gas supplier includes a gas supply pipe 16 provided with many gas supply ports opened as holes or slits. At least one gas supply pipe 16 is disposed near the carry-in port 18 in the lamp house 12.

In the light irradiation device of FIG. 1, the gas supplier includes a plurality of gas supply pipes 16. The gas supply pipes 16 each extend parallel to the extending direction of the ultraviolet lamps 11, and are each disposed equidistantly from its adjacent ones of the ultraviolet lamps 11 on the rear surface side of the ultraviolet lamps 11.

Treatment-Space Gas:

In the light irradiation device according to the first embodiment of the present invention, the treatment-space gas is produced by mixing a gas containing oxygen (hereinafter, referred to also as an "oxygen-containing gas") with an inert gas serving as a principal component.

As examples of the inert gas, may be mentioned a nitrogen gas, an argon gas and a xenon gas.

It is preferable that an oxygen-containing gas is mixed with an inert gas specifically in the form of clean dry air (CDA). Alternatively, a gas produced by mixing an oxygen gas with CDA and adjusting its oxygen concentration appropriately may be mixed with an inert gas.

The treatment-space gas is supplied by a gas mixing and supplying mechanism. As shown in FIG. 1, for example, the gas mixing and supplying mechanism includes: an inert gas supply source 31 comprising an inert gas cylinder for supplying an inert gas; an oxygen-containing gas supply source 32 comprising an oxygen-containing gas cylinder for supplying an oxygen-containing gas; and a gas mixer 33 for mixing the inert gas and the oxygen-containing gas supplied by the inert gas supply source 31 and the oxygen-containing gas supply source 32 to prepare the treatment-space gas. The gas mixing and supplying mechanism supplies the treatment-space gas from the gas mixer 33 to the gas supply pipes 16.

The oxygen concentration in the treatment-space gas is set to 1 to 5% by volume, for example. In particular, such an oxygen concentration may preferably be set to 2.5% by volume.

An excessively high oxygen concentration in the treatment-space gas may cause the attenuation of ultraviolet light in the ultraviolet radiation space to increase to a level interfering with optical cleaning. An excessively low oxygen concentration in the treatment-space gas, on the other hand, results in an extremely low ozone yield. Due to such a low yield, activating action caused by ozone may not work well on the front surface of the workpiece, thus failing to obtain a sufficient optical cleaning effect.

The oxygen concentration in the treatment-space gas can be adjusted by controlling the supply amount of the inert gas supplied by the inert gas supply source 31 and the supply amount of the oxygen-containing gas supplied by the oxygen-containing gas supply source 32. Specifically, the supply amount of the inert gas is set to 100 to 120 L/min, for example, and the supply amount of CDA having an oxygen concentration of about 21% by volume is set to 13 to 17 L/min, for example.

The oxygen concertation in the treatment-space gas can be adjusted also by selecting a type (oxygen concentration) of oxygen-containing gas to fill the oxygen-containing gas supply source 32.

An oxygen concertation detector (not shown) may be disposed in the lamp house 12, and the oxygen concentration in the treatment-space gas may be feedback-controlled so that the oxygen concentration in the lamp house 12 has a predetermined fixed value.

A gas discharge port 17 for exhausting gas in the exhaust space forming member 13 forcibly to the outside is provided at a bottom part (a lower part in FIG. 1) of the exhaust space forming member 13.

In such a light irradiation device, it is preferable that an exhaust amount from the gas discharge port 17 of the exhaust space forming member 13 is greater than a gas supply amount from the gas supply pipes 16 of the gas supplier.

A sub-chamber 21 is provided on the upstream side of the treatment chamber 10 in the transport path in proximity to the carry-in port 18. It is also preferable that a sub-chamber 22 is provided on the downstream side of the treatment chamber 10 in the transport path in proximity to the carry-out port 19.

The sub-chambers 21 and 22 are formed by exhaust parts 21A and 21B and exhaust parts 22A and 22B, respectively, which are faced to each other with the transport path interposed therebetween. These sub-chambers 21 and 22 forcibly exhaust, to the outside, gas leaked from the interior of the exhaust space forming member 13 and the interior of the lamp house 12 through the carry-in port 18 and the carry-out port 19.

It is preferable that an exhaust amount from the sub-chambers 21 and 22 is greater than a gas supply amount of the treatment-space gas from the gas supply pipes 16 of the gas supplier.

If the workpiece W has a plate shape, a structure including a plurality of transport rollers provided to transport the workpiece W thereon, for example, may be used as transporter configured to transport the workpiece W along the transport path. If the workpiece W is a film in the form of a continuous sheet, a structure for winding the sheet-like film, which is stretched tightly between a feed roll and a take-up roll, from the feed roll to the take-up roll, for example, may be used as transporter.

Dimensions and the like of the light irradiation device of the present invention will be presented below. For the workpiece W having a width of 500 mm, for example, the length of the treatment chamber 10 in the transport direction of the workpiece W is 445 mm and the length of the treatment chamber 10 in the width direction of the workpiece W is 1090 mm.

The distance (gap) of the gas circulation resistance bottleneck G is 10 mm, the distance between the treatment region where the workpiece W is to be placed and a ceiling surface (the upper surface in FIG. 1) of the lamp house 12 is 72 mm, and the distance between the treatment region where the workpiece W is to be placed and a bottom surface (the lower surface in FIG. 1) of the exhaust space forming member 13 is 150 mm.

The pressure in the lamp house 12 is a positive pressure higher than the external atmosphere (atmospheric pressure) by 2 Pa, and the pressure in the exhaust space forming member 13 is a negative pressure lower than the external atmosphere (atmospheric pressure) by 2 Pa, i.e., the difference between these pressures is 4 Pa.

The length of the ultraviolet lamp 11 is 640 mm, and the effective irradiation width of the ultraviolet lamp 11 is 510 mm. The distance between the front surface (the lower surface in FIG. 1) of the ultraviolet lamp 11 and the treatment region where the workpiece W is to be placed is 4 mm.

If the treatment-space gas from the gas supply ports comprises a nitrogen gas and CDA, the supply amount of the inert gas is 100 L/min, and the supply amount of CDA is 13 L/min. The exhaust amount of gas from the gas discharge port 17 of the exhaust space forming member 13 is 200 L/min, and the exhaust amounts from the exhaust parts 21A, 21B, 22A and 22B of the sub-chambers 21 and 22 are each 200 L/min.

When the light irradiation device uses a gas into which an oxygen-containing gas has been mixed as the above-described treatment-space gas, an ultraviolet irradiation treatment is performed as follows. In particular, a workpiece W is carried into the treatment region through the carry-in port 18 of the treatment chamber 10 by the transporter along the transport path. Along with the transport of the workpiece W into the treatment region, only a small amount of air being attached to the front surface of the workpiece W is introduced into the surroundings of the treatment region due to the small distance between the shielding body (frame part 12A) provided in the opening 12H of the lamp house 12 and each edge of the workpiece W in its width direction (the distance of the gas circulation resistance bottleneck G). In the lamp house 12, on the other hand, the treatment-space gas having an adjusted oxygen concentration is supplied from the gas supply ports of the gas supply pipes 16 by the gas mixing and supplying mechanism. The supplied treatment-space gas fills the interior of the lamp house 12 to cool the ultraviolet lamps 11 and to replace air in the ultraviolet radiation space between the ultraviolet lamps 11 and the workpiece W with the treatment-space gas. The treatment-space gas having filled the interior of the lamp house 12 flows out little by little through the gas circulation resistance bottleneck G, which is present between the shielding body (frame part 12A) provided in the opening 12H and each edge of the workpiece W in its width direction, into the exhaust space in the exhaust space forming member 13. Such a treatment-space gas is forcibly exhausted from the gas discharge port 17 of the exhaust space forming member 13 together with ozone generated in the lamp house 12 and in the exhaust space. The treatment-space gas having been supplied into the lamp house 12 and the ozone having been generated in the lamp house 12 and in the exhaust space also flow out in the directions of the sub-chambers 21 and 22 through the carry-in port 18 and the carry-out port 19 of the treatment chamber 10 to be forcibly exhausted also from the exhaust parts 21A, 21B, 22A and 22B of the sub-chambers 21 and 22.

Ultraviolet light is emitted from the ultraviolet lamp 11 toward one surface of the workpiece W transported to the treatment region. If the workpiece W is made of glass, for example, contaminants, such as organic substances, which are present on the one surface of the workpiece W, are degraded and removed (cleaned) by the emitted ultraviolet light and ozone generated by irradiating an oxygen gas, which is contained in the treatment-space gas, and a small amount of air, which has been introduced along with the transport of the workpiece W, with ultraviolet light. Consequently, the wettability and the like of the front surface are improved. If the workpiece W is made of a resin, e.g., a film, contaminants, such as organic substances, which are present on the one surface (front surface) of the workpiece W, are degraded and removed (cleaned) first, and then the surface quality of the film is improved so as to enhance its wettability. Thereafter, the workpiece W having been subjected to the irradiation with ultraviolet light is carried out of the carry-out port 19 along the transport path.

If the workpiece W is a sheet-like film, for example, the transport speed of the workpiece W is set to 0.5 to 40 m/min. If the workpiece W is a plate-shaped glass substrate, for example, the transport speed of the workpiece W is set to 0.5 to 9 m/min.

In the light irradiation device according to the above-described first embodiment, the oxygen concentration in the ultraviolet radiation space can be stably adjusted to a desired range by supplying the treatment-space gas, which is produced by mixing an oxygen-containing gas with an inert gas serving as a principal component, into the lamp house 12 regardless of the transport speed of the workpiece, which is determined on the basis of its type and shape. Consequently, the oxygen concentration in the ultraviolet radiation space can be prevented from varying. Thus, an oxygen gas, serving as a source of ozone active species, is actively supplied into the ultraviolet radiation space while stably preventing the attenuation of ultraviolet light in the ultraviolet radiation space. Thus, optical cleaning can be performed with high stability.

In the light irradiation device having the shielding body in the opening 12H of the lamp house 12 to form the gas circulation resistance bottleneck G between the shielding body and each edge part of the workpiece W in its width direction, airtightness in the lamp house 12 is increased. As a result, air in the ultraviolet radiation space can be replaced with a desired gas atmosphere using a smaller amount of gas in comparison with the conventional techniques. On the other hand, the atmosphere in the ultraviolet radiation space is stabilized under the condition of less supply of an oxygen gas or water from the outside into the ultraviolet radiation space along with the transport of the workpiece W. Therefore, an appropriate amount of oxygen gas is actively supplied into the lamp house 12 according to the light irradiation device as described above, and thus the oxygen concentration in the lamp house 12 can be adjusted to a desired range in an extremely stable manner.

Figure 4:
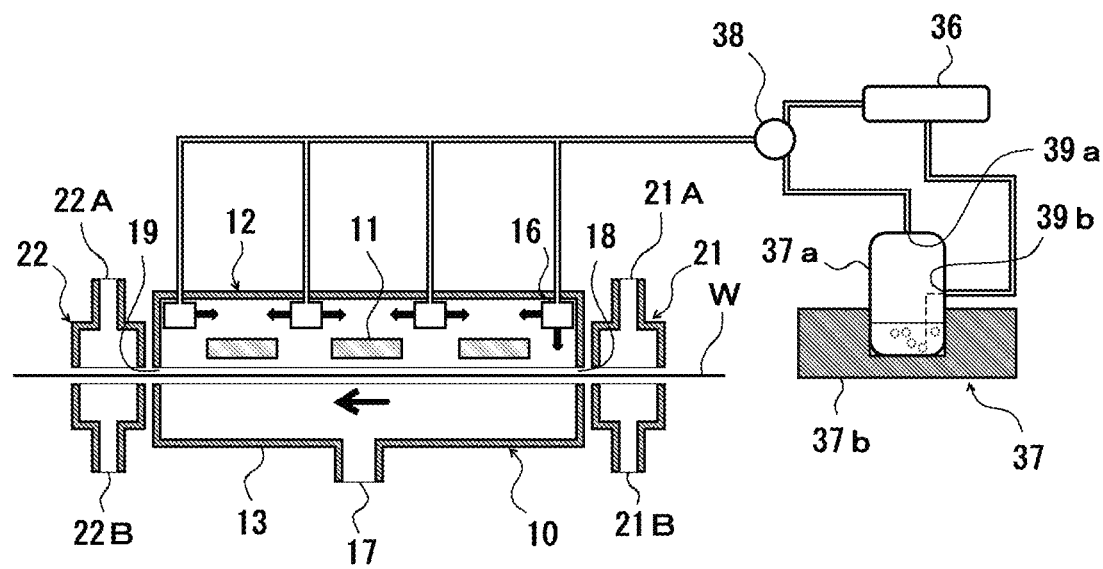
FIG. 4 is a schematic view of a light irradiation device according to a second embodiment of the present invention, including its cross-section in the transport direction of a workpiece.

FIG. 4 is a schematic view of a light irradiation device according to a second embodiment of the present invention, including its cross-section in the transport direction of a workpiece.

This light irradiation device has the same configuration as the light irradiation device according to the first embodiment except that a treatment-space gas is produced by mixing water with an inert gas serving as a principal component. Elements same as those in the light irradiation device of the first embodiment will be denoted by the same reference numerals.

As examples of the inert gas, may be mentioned a nitrogen gas, an argon gas and a xenon gas.

Water is mixed in the treatment-space gas so that the relative humidity in a lamp house 12 becomes 18 to 30% RH, for example.

An excessively large amount of water mixed into the treatment-space gas increases an amount of vacuum ultraviolet light absorbed by water molecules, thereby attenuating an amount of ultraviolet light reaching the workpiece W. Consequently, the ability to perform optical cleaning and improve the surface quality may be deteriorated. An excessively small amount of water mixed into the treatment-space gas, on the other hand, results in an extremely low yield of active species such as oxygen radicals or hydroxyl radicals. Due to such a low yield, activating action caused by such active species may not work well on the front surface of the workpiece, thus failing to obtain a sufficient optical cleaning effect.

A hygrometer (not shown) may be disposed in the lamp house 12, and an amount of water mixed into the treatment-space gas may be feedback-controlled so that the relative humidity in the lamp house 12 has a predetermined fixed value.

As shown in FIG. 4, a gas mixing and supplying mechanism in the light irradiation device in this example includes: an inert gas supply source 36 comprising an inert gas cylinder for supplying an inert gas; a humidifier 37 for humidifying the gas introduced; and a gas mixer 38 for mixing dry inert gas supplied by the inert gas supply source 36 and the humidified inert gas supplied by the humidifier 37 to prepare the treatment-space gas. The gas mixing and supplying mechanism supplies the treatment-space gas from the gas mixer 38 to gas supply pipes 16.

The humidifier 37 includes a humidifier tank 37a that retains pure water and a heater 37b for heating the humidifier tank 37a. In the humidifier 37, the inert gas having been supplied by the inert gas supply source 36 through an inlet 39b of the humidifier tank 37a is introduced into the pure water in the humidifier tank 37a or into water vapor produced by heating the pure water by the heater 37b, thereby mixing water with the inert gas. The inert gas with which water has been mixed is taken out through an outlet 39a provided in an upper part of the humidifier tank 37a and supplied to the gas mixer 38.

The amount of water to be mixed with the inert gas introduced into the humidifier tank 37a can be adjusted by controlling the water temperature of the pure water in the humidifier tank 37a. Thus, an amount of water to be mixed into the treatment-space gas can be adjusted.

The amount of water to be mixed into the treatment-space gas can be adjusted also by controlling the supply amount of dry inert gas directly supplied from the inert gas supply source 36 and the supply amount of the humidified inert gas supplied from the inert gas supply source 36 via the humidifier 37.

When the light irradiation device uses a gas into which water has been mixed as the above-described treatment-space gas, an ultraviolet irradiation treatment is performed as follows. In particular, a workpiece W is carried into the treatment region through the carry-in port 18 of the treatment chamber 10 by the transporter along the transport path. Along with the transport of the workpiece W into the treatment region, only a small amount of air being attached to the front surface of the workpiece W is introduced into the surroundings of the treatment region due to a small distance between the shielding body (frame part 12A) provided in the opening 12H of the lamp house 12 and each edge part of the workpiece W in its width direction (the distance of the gas circulation resistance bottleneck G). In the lamp house 12, on the other hand, the treatment-space gas including an adjusted amount of mixed water is supplied from the gas supply ports of the gas supply pipes 16 by the gas mixing and supplying mechanism. The supplied treatment-space gas fills the interior of the lamp house 12 to cool ultraviolet lamps 11 and to replace air in the ultraviolet radiation space between the ultraviolet lamps 11 and the workpiece W with the treatment-space gas. The treatment-space gas having filled the interior of the lamp house 12 flows out little by little through the gas circulation resistance bottleneck G, which is present between the shielding body (frame part 12A) provided in the opening 12H and each edge part of the workpiece W in its width direction, into the exhaust space in the exhaust space forming member 13. Such a treatment-space gas is forcibly exhausted from the gas discharge port 17 of the exhaust space forming member 13 together with ozone generated in the lamp house 12 and in the exhaust space. The treatment-space gas having been supplied into the lamp house 12 and the ozone having been generated in the lamp house 12 and in the exhaust space also flow out in the directions of sub-chambers 21 and 22 through the carry-in port 18 and the carry-out port 19 of the treatment chamber 10 to be forcibly exhausted also from the exhaust parts 21A, 21B, 22A and 22B of the sub-chambers 21 and 22.

When ultraviolet light is emitted from the ultraviolet lamps 11 toward one surface of the workpiece W transported to the treatment region, contaminants, such as organic substances, which are present on the one surface of the workpiece W, are degraded and removed (cleaned) by the emitted ultraviolet light as well as oxygen radicals, hydroxyl radicals, or the like, generated by irradiating, with ultraviolet light, water contained in the treatment-space gas and a small amount of air having been introduced along with the transport of the workpiece W. Consequently, the wettability and the like of the front surface are improved. Thereafter, the workpiece W having been subjected to the irradiation with ultraviolet light is carried out of the carry-out port 19 along the transport path.

In the light irradiation device according to the above-described second embodiment, the humidity in the ultraviolet radiation space can be stably adjusted to a desired range by supplying the treatment-space gas, which is produced by mixing water with an inert gas serving as a principal component, into the lamp house 12 regardless of the transport speed of the workpiece, which is determined on the basis of its type and shape. Consequently, water in the ultraviolet radiation space can be prevented from varying. Thus, water, serving as a source of active species such as oxygen radicals or hydroxyl radicals, is actively supplied into the ultraviolet radiation space while stably preventing the attenuation of ultraviolet light in the ultraviolet radiation space. Thus, optical cleaning can be performed with high stability.

In the light irradiation device including the shielding body in the opening 12H of the lamp house 12 to form the gas circulation resistance bottleneck G between the shielding body and each edge part of the workpiece W in its width direction, airtightness in the lamp house 12 is increased. As a result, air in the ultraviolet radiation space can be replaced with a desired gas atmosphere using a smaller amount of gas in comparison with the conventional techniques. On the other hand, the atmosphere in the ultraviolet radiation space is stabilized under the condition of less supply of an oxygen gas or water from the outside into the ultraviolet radiation space along with the transport of the workpiece W. Therefore, an appropriate amount of water is actively supplied into the lamp house 12 according to the light irradiation device as described above, and thus the humidity in the lamp house 12 can be adjusted to a desired range in an extremely stable manner.

Although the first and second embodiments of the present invention have been described above, the present invention is not limited to the above-described embodiments and various modifications can be made thereto.

For example, a treatment-space gas may be produced by mixing both of an oxygen-containing gas and water with an inert gas serving as a principal component.

Alternatively, the shielding body may be configured, for example, such that an edge part of the shielding body extending in the transport direction of a workpiece covers the other surface of an edge part of the workpiece.

Figure 5:
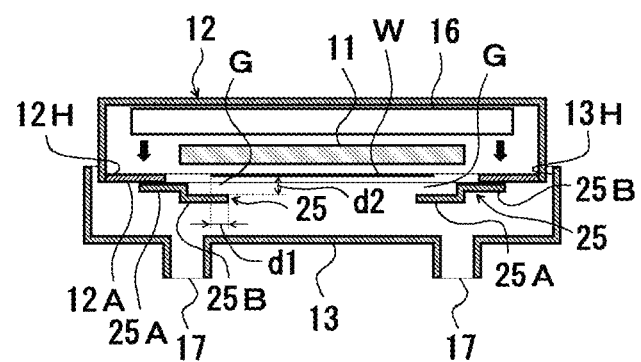
FIG. 5 is a cross-sectional view in the width direction of a workpiece, schematically showing another example of the light irradiation device of the present invention.
Figure 6:
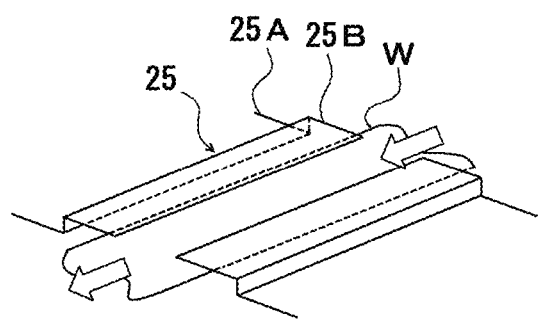
FIG. 6 is a perspective view as seen from an exhaust space side, which schematically explains a main part of the light irradiation device of FIG. 5.

Specifically, the shielding body may include a shielding member 25 having a base end part 25A and a leading end part 25B formed continuously in a crank shape as shown in FIGS. 5 and 6. In the shielding member 25, the base end part 25A is bonded to a lower surface side (the lower surface side in FIG. 5) of a frame part 12A of a lamp house 12, and the leading end part 25B protrudes so as to cover the other surface (the lower surface in FIG. 5) of each edge part of the workpiece W in its width direction, without being in contact therewith. Such a configuration creates a gas circulation resistance bottleneck G between the other surface (the lower surface in FIG. 5) of the workpiece W and an upper surface (the upper surface in FIG. 5) of the leading end part 25B of the shielding member 25. A distance d1 in the width direction of the workpiece W between an edge of the leading end part 25B of the shielding member 25 extending in the transport direction of the workpiece W and an edge of the treatment region where the workpiece W is to be placed in its width direction is set to 0 to 5 mm. A distance d2 in the height direction between the upper surface of the leading end part 25B of the shielding member 25 and a passing plane on the side of the other surface of the treatment region where the workpiece W is to be placed is set to 5 to 10 mm. In the light irradiation device in this example, a distance between the frame part 12A of the lamp house 12 and each edge of the workpiece W in its width direction may be greater than that in the light irradiation device shown in FIGS. 1 to 3. Note that FIG. 6 is a perspective view as seen from the exhaust space side. In FIGS. 5 and 6, the same components as those in the light irradiation device of FIGS. 1 to 3 are denoted by the same reference numerals.

Figure 7:
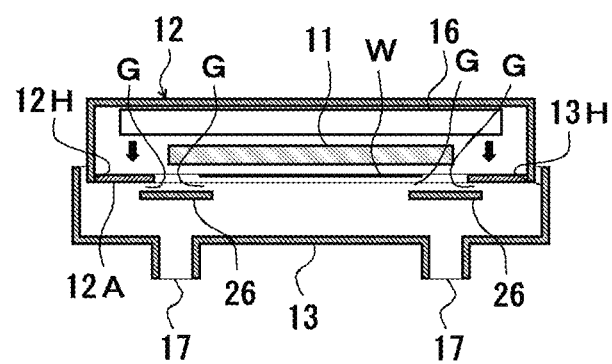
FIG. 7 is a cross-sectional view in the width direction of a workpiece, schematically showing still another example of the light irradiation device of the present invention.
Figure 8:
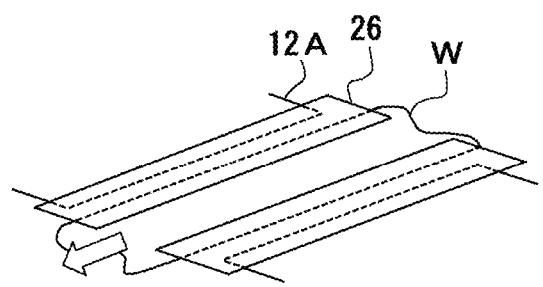
FIG. 8 is a perspective view as seen from an exhaust space side, which schematically explains a main part of the light irradiation device of FIG. 7.

Alternatively, the shielding body may include a plate-shaped shielding member 26 as shown in FIGS. 7 and 8. The plate-shaped shielding member 26 is disposed in such a manner that both ends thereof in the transport direction of a workpiece W are supported while covering a lower surface (the lower surface in FIG. 7) of each edge part of the frame part 12A of the lamp house 12 extending in the transport direction of the workpiece W and the other surface (the lower surface in FIG. 7) of each edge part of the workpiece W in its width direction, without being in contact therewith. Such a configuration creates gas circulation resistance bottlenecks G between the other surface of each edge part of the workpiece W in its width direction and an upper surface (the upper surface in FIG. 7) of the shielding member 26 as well as between the lower surface of each edge part of the frame part 12A of the lamp house 12 extending in the transport direction of the workpiece W and the upper surface of the shielding member 26. A distance in the width direction of the workpiece W between an inner edge of the shielding member 26 extending in the transport direction of the workpiece W and an edge of the treatment region where the workpiece W is to be placed in its width direction is set to 0 to 5 mm. A distance in the height direction between the upper surface of the shielding member 26 and a passing plane on the side of the other surface of the treatment region where the workpiece W is to be placed is set to 5 to 10 mm. A distance in the width direction of the workpiece W between an outer edge of the shielding member 26 extending in the transport direction of the workpiece W and an edge of the frame part 12A of the lamp house 12 is set to 0 to 5 mm. A distance in the height direction between the upper surface of the shielding member 26 and the lower surface of the frame part 12A of the lamp house 12 is set to 5 to 10 mm. In the light irradiation device in this example, a distance between the frame part 12A of the lamp house 12 and each edge of the workpiece W in its width direction may be greater than that in the light irradiation device shown in FIGS. 1 to 3. Note that FIG. 8 is a perspective view as seen from the exhaust space side. In FIGS. 7 and 8, the same components as those in the light irradiation device of FIGS. 1 to 3 are denoted by the same reference numerals.

Figure 9:
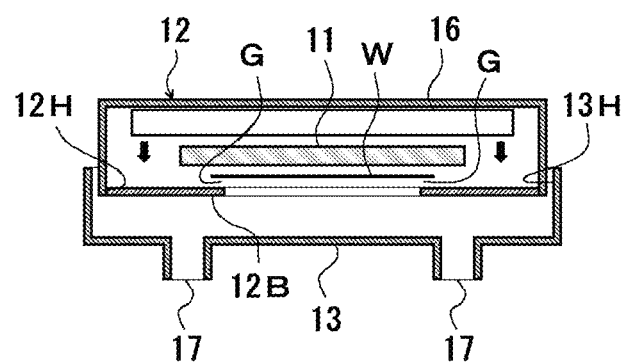
FIG. 9 is a cross-sectional view in the width direction of a workpiece, schematically showing still further another example of the light irradiation device of the present invention.
Figure 10:
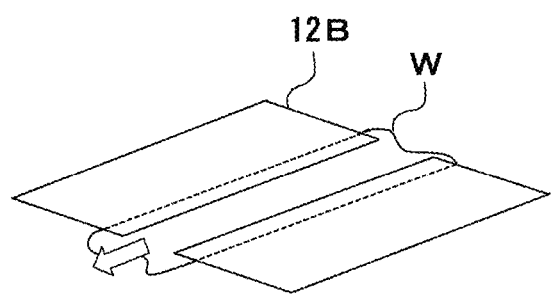
FIG. 10 is a perspective view as seen from an exhaust space side, which schematically explains a main part of the light irradiation device of FIG. 9.

Alternatively, the shielding body may be formed by a plate-shaped frame part 12B extending continuously with the opening 12H of the lamp house 12 along a parallel plane at a level position more on the side of the other surface of a workpiece W than the transport plane of the workpiece W, and an edge part of the frame part 12B extending in the transport direction of the workpiece W may protrude so as to cover the other surface of an edge part of the workpiece W in its width direction as shown in FIGS. 9 and 10, without being in contact therewith. Such a configuration creates a gas circulation resistance bottleneck G between the other surface (the lower surface in FIG. 9) of the workpiece W and the upper surface (the upper surface in FIG. 9) of the frame part 12B of the lamp house 12. A distance in the width direction of the workpiece W between an edge of the frame part 12B extending in the transport direction of the workpiece W and an edge of the treatment region where the workpiece W is to be placed in its width direction is set to 0 to 5 mm. A distance in the height direction between the upper surface of the frame part 12B and a passing plane on the side of the other surface of the treatment region where the workpiece W is to be placed is set to 5 to 10 mm. Note that FIG. 10 is a perspective view as seen from the exhaust space side. In FIGS. 9 and 10, the same components as those in the light irradiation device of FIGS. 1 to 3 are denoted by the same reference numerals.

Alternatively, the shielding body may be provided, for example, so as to cover the entire other surface of a workpiece.

Figure 11:
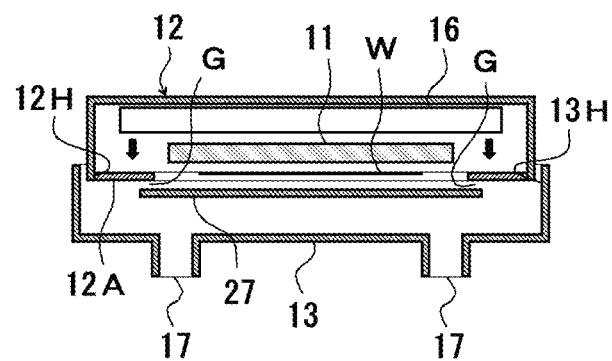
FIG. 11 is a cross-sectional view in the width direction of a workpiece, schematically showing still further another example of the light irradiation device of the present invention.
Figure 12:
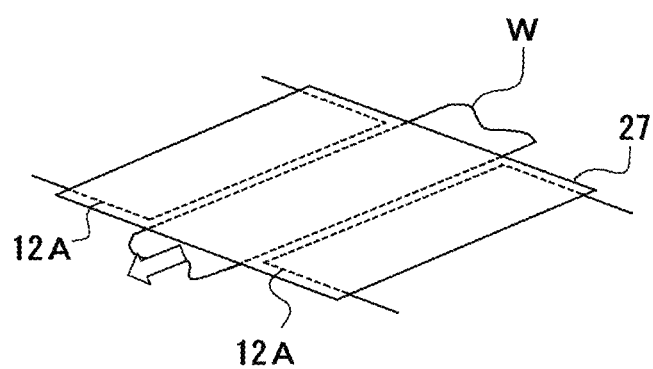
FIG. 12 is a perspective view as seen from an exhaust space side, which schematically explains a main part of the light irradiation device of FIG. 11.

Specifically, the shielding body may include a plate-shaped shielding member 27 as shown in FIGS. 11 and 12. The shielding member 27 is disposed in such a manner that both ends thereof in the transport direction of the workpiece W are supported while covering the lower surface (the lower surface in FIG. 11) of each edge part of the frame part 12A of the lamp house 12 extending in the transport direction of the workpiece W and the entire other surface of the workpiece W, without being in contact therewith. Such a configuration creates a gas circulation resistance bottleneck G between the lower surface of each edge part of the frame part 12A of the lamp house 12 in the transport direction of the workpiece W and the upper surface (the upper surface in FIG. 11) of the shielding member 27. A distance in the width direction of the workpiece W between an edge of the shielding member 27 extending in the transport direction of the workpiece W and an edge of the frame part 12A of the lamp house 12 is set to 0 to 5 mm. A distance in the height direction between the upper surface of the shielding member 27 and the lower surface of the frame part 12A of the lamp house 12 is set to 5 to 10 mm. In the light irradiation device in this example, a distance between the frame part 12A of the lamp house 12 and each edge of the workpiece W in its width direction may be greater than that in the light irradiation device of FIGS. 1 to 3. Note that FIG. 12 is a perspective view as seen from the exhaust space side. In FIGS. 11 and 12, the same components as those in the light irradiation device of FIGS. 1 to 3 are denoted by the same reference numerals.

Alternatively, a shielding body may be provided, for example, so that each edge part of the shielding body extending in the transport direction of a workpiece can change its position in the width direction of the workpiece.

Figure 13:
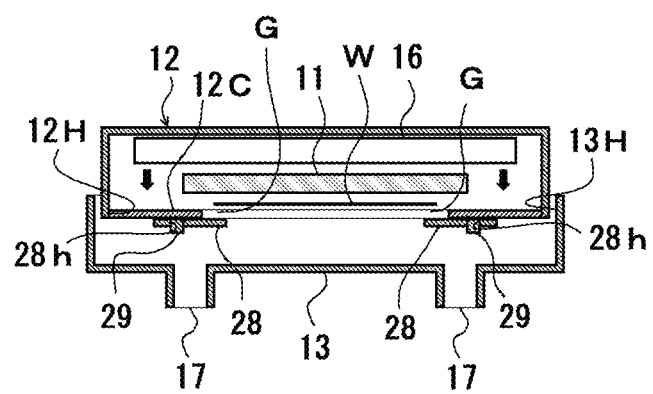
FIG. 13 is a cross-sectional view in the width direction of a workpiece, schematically showing still further another example of the light irradiation device of the present invention.
Figure 14:
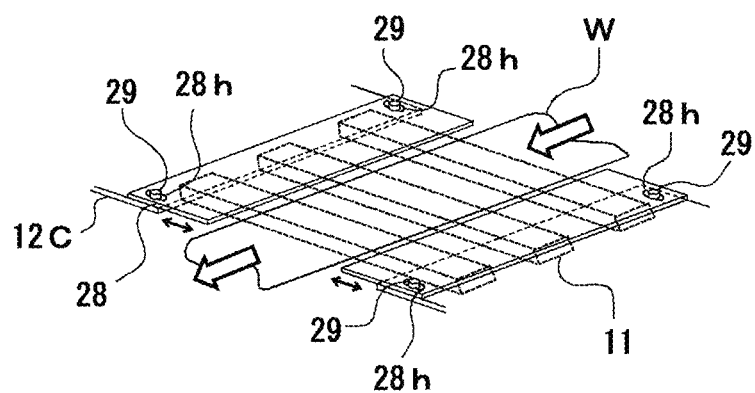
FIG. 14 is a perspective view as seen from an exhaust space side, which schematically explains a main part of the light irradiation device of FIG. 13.

Specifically, the shielding body may include, as shown in FIGS. 13 and 14, a plate-shaped shielding member 28 supported on the other surface (the lower surface in FIG. 13) of a plate-shaped frame part 12C extending continuously with the opening 12H of the lamp house 12 along a parallel plane at a level position more on the side of the other surface of the workpiece W than the transport plane of the workpiece W, and protruding so as to cover the other surface (the lower surface in FIG. 13) of each edge part of the workpiece W in its width direction, without being in contact therewith. Each edge part of the shielding member 28 supported on the frame part 12C of the lamp house 12 includes elongated holes 28h, elongated in the width direction of the workpiece W, at a leading end part and a rear end part of the shielding member 28 in the transport direction of the workpiece W, i.e., the total of four elongated holes 28h. The shielding member 28 is fixed to the lamp house 12 by securing the elongated holes 28h and the frame part 12C of the lamp house 12 together by screws 29. A protruding length, in the width direction of the workpiece W, of each edge part of the shielding member 28 extending in the transport direction of the workpiece W can be changed by adjusting the screwing positions in the elongated holes 28h. In the light irradiation device in this example, a gas circulation resistance bottleneck G is created between the other surface (the lower surface in FIG. 13) of the workpiece W and the upper surface (the upper surface in FIG. 13) of the shielding member 28. A distance in the width direction of the workpiece W between an edge of the shielding member 28 extending in the transport direction of the workpiece W and an edge of the treatment region where the workpiece W is to be placed in its width direction is set to 0 to 5 mm. A distance in the height direction between the upper surface of the shielding member 28 and a passing plane on the side of the other surface of the treatment region where the workpiece W is to be placed is set to 5 to 10 mm. In FIGS. 13 and 14, the same components as those in the light irradiation device of FIGS. 1 to 3 are denoted by the same reference numerals.

In the light irradiation device of the present invention, if a workpiece includes a hole, a wind shielding body for covering the hole may be provided, for example.

A case where a workpiece including holes is used in the light irradiation device shown in FIGS. 7 and 8, for example, will be described.

Figure 15:
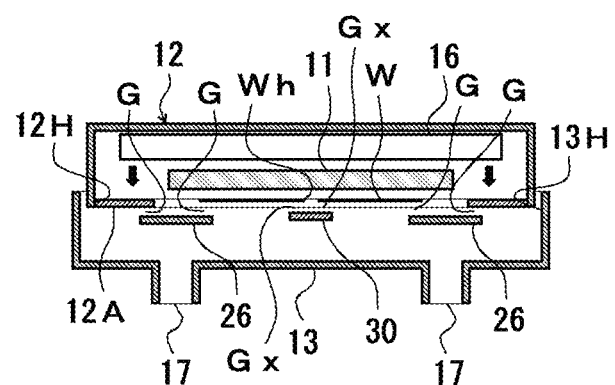
FIG. 15 is a cross-sectional view in the width direction of a workpiece, schematically showing still further another example of the light irradiation device of the present invention.
Figure 16:
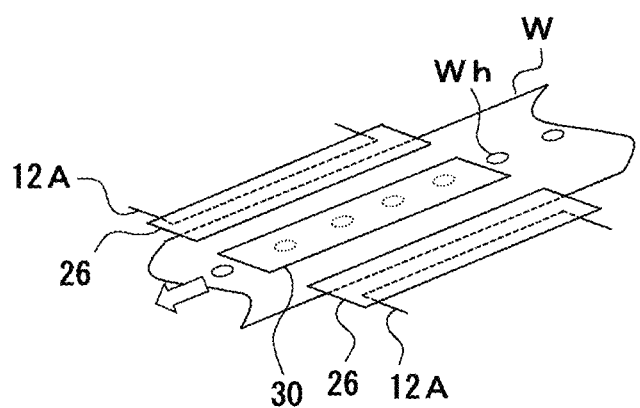
FIG. 16 is a perspective view as seen from an exhaust space side, which schematically explains a main part of the light irradiation device of FIG. 15.

As shown in FIGS. 15 and 16, a plate-shaped wind shielding body 30 is disposed in such a manner that both ends thereof in the transport direction of the workpiece W are supported while covering a plurality of through holes Wh provided in a central part of the workpiece W in its width direction to be spaced apart from one another in the transport direction, without being in contact therewith. Such a configuration creates, between each edge part of the through hole Wh on the other surface of the workpiece W and the upper surface (the upper surface in FIG. 15) of the wind shielding body 30, a gas circulation resistance bottleneck Gx that disturbs free gas circulation between the space in the lamp house 12 and the space in the exhaust space forming member 13. A distance in the width direction of the workpiece W between each edge of the wind shielding body 30 extending in the transport direction of the workpiece W and a position where the through hole Wh is to be provided in the workpiece W is set to 0 to 5 mm. A distance in the height direction between the upper surface of the wind shielding body 30 and a passing plane on the side of the other surface of the treatment region where the workpiece W is to be placed is set to 5 to 10 mm. Note that FIG. 16 is a perspective view as seen from the exhaust space side. In FIGS. 15 and 16, the same components as those in the light irradiation device of FIGS. 7 and 8 are denoted by the same reference numerals.

According to such a light irradiation device, even when the workpiece W includes the through holes Wh, airtightness in the lamp can be improved by increased gas circulation resistance due to the disturbance of free gas circulation through the through holes Wh.

EXAMPLES

Although specific examples of the present invention will be described below, the present invention is not limited thereto.

Example 1

A light irradiation device [1] having the configuration according to FIGS. 1 to 3 was produced. The specific configuration is as follows.

Treatment chamber; length in the transport direction of a workpiece: 445 mm, length in the width direction of the workpiece: 1090 mm, distance between the treatment region and the ceiling surface of the lamp house: 72 mm, distance between the treatment region and the bottom surface of the exhaust space forming member: 150 mm, distance (gap) of the gas circulation resistance bottleneck: 10 mm Ultraviolet lamp; type: xenon excimer lamp, the number of lamps: 3 lamps, center wavelength: 172 nm, intensity of illumination: 170 mW/cm$^2$ (the front surface of the lamp), length: 650 mm, effective irradiation width: 510 mm, distance between the ultraviolet lamp and the treatment region: 4 mm Pressure in the lamp house: positive pressure higher than the external atmosphere (atmospheric pressure) by 2 Pa Pressure in the exhaust space forming member: negative pressure lower than the external atmosphere (atmospheric pressure) by 2 Pa (pressure difference is 4 Pa)

Treatment-space gas; type: nitrogen gas and CDA, supply amount of nitrogen gas: 100 L/min, supply amount of CDA: 13 L/min Exhaust amount of gas from the gas discharge port of the exhaust space forming member: 200 L/min Each of exhaust amounts from the exhaust parts of the sub-chambers: 200 L/min Workpiece; type: a sheet-like PET film, width: 500 mm Comparative Example 1

A light irradiation device [1X] was produced for comparison using a configuration the same as that of Example 1 except that only a nitrogen gas was supplied without the supply of CDA.

In these light irradiation devices [1] and [1X], the transport speed of the workpieces was changed to 0 to 20 m/min, and oxygen concentrations on the front surfaces of the workpieces positioned in the treatment regions of the transport paths were measured. In the light irradiation device [1] according to the example in which CDA was mixed with a nitrogen gas, the oxygen concentration on the front surface of the workpiece positioned in the treatment region of the transport path was about 2.5%±0.1%. The oxygen concentration on the front surface in the light irradiation device [1X] according to the comparative example, on the other hand, was about 2.5 to 5.5%. Thus, it was confirmed that an oxygen concentration in the ultraviolet radiation space can be substantially prevented from varying and can be adjusted to a desired oxygen concentration.

Example 2A, Example 2B, Example 2C and Example 2D

Four light irradiation devices having the configuration according to FIG. 4 were produced.

Specifically, light irradiation devices [2A], [2B], [2C] and [2D] according to the present invention were produced in the same manner as that in Example 1 except that a gas produced by mixing dry nitrogen gas and humidified nitrogen gas was supplied as a treatment-space gas and the temperature of pure water in the humidifier tank was appropriately changed to obtain relative humidity values of 15% RH, 21% RH, 30% RH and 48% RH, respectively, in the atmosphere in the lamp house.

Comparative Example 2

A light irradiation device [2X] was produced for comparison using the same configuration as that of Example 2A except that only dry nitrogen gas was supplied as a treatment-space gas. Note that the relative humidity in the atmosphere in the lamp house of the light irradiation device [2X] was 5% RH.

In each of these light irradiation devices [2A], [2B], [2C], [2D] and [2X], an ultraviolet irradiation treatment was performed with the transport speed of the workpiece being set to 14 m/min. An amount of change Δθ in contact angle on the front surface of the workpiece between before and after the ultraviolet irradiation treatment was then calculated. Such a contact angle on the front surface of the workpiece was measured using "G-1-1000" (manufactured by ERMA INC.). The results are shown in the graph of FIG. 17.

Figure 17:
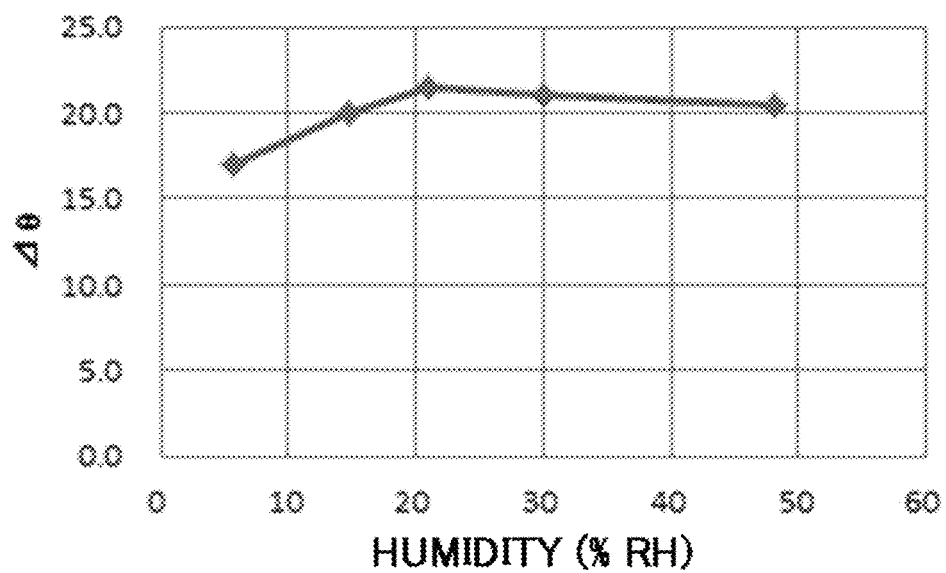
FIG. 17 is a graph showing states of front surfaces of workpieces (amounts of changes Δθ in contact angles) in examples.
Figure 18:
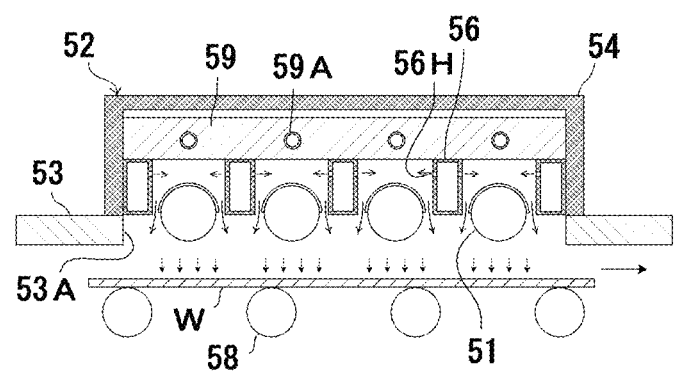
FIG. 18 is a cross-sectional view schematically showing one example of a conventional light irradiation device in the transport direction of a workpiece.

As is apparent from the graph of FIG. 17, in the light irradiation devices [2A], [2B], [2C] and [2D] according to the examples in which water was mixed with a nitrogen gas, an amount of change Δθ in contact angle on the front surface of the workpiece between before and after the ultraviolet irradiation treatment was, at the maximum, about 1.2 times larger than that in the light irradiation device [2X] according to the comparative example. That is, it was confirmed that increasing the relative humidity in the ultraviolet radiation space can enhance the effect of improving the surface quality of the workpiece.

REFERENCE SIGNS LIST 10 treatment chamber
11 ultraviolet lamp
12 lamp house
12A, 12B, 12C frame part
12H opening
13 exhaust space forming member
13H opening
15H opening
16 gas supply pipe
17 gas discharge port
18 carry-in port
19 carry-out port
21, 22 sub-chamber
21A, 21B, 22A, 22B exhaust part
25, 26, 27, 28 shielding member
25A base end part
25B leading end part
28h elongated hole
29 screw
30 wind shielding body
31 inert gas supply source
32 oxygen-containing gas supply source
33 gas mixer
36 inert gas supply source
37 humidifier
37a humidifier tank
37b heater
38 gas mixer
39a outlet
39b inlet
51 excimer lamp
52 lamp house
53 base member
53A light irradiation port
54 outer cover
56 gas supply pipe
56H gas supply port
58 transporter
59 cooling block
59A pipe
G, Gx gas circulation resistance bottleneck
W workpiece
Wh through hole

The invention claimed is:

1. A light irradiation device configured to emit ultraviolet light to one surface of a band-shaped workpiece transported along a transport path, comprising:
  a lamp house having an opening along a passing plane on a side of the one surface of the workpiece in the transport path;
  an ultraviolet lamp provided in the lamp house so as to extend in a width direction of the workpiece;
  gas supplier configured to supply a treatment-space gas into the lamp house; and
  an exhaust space forming member having an opening along a passing plane on a side of the other surface of the workpiece in the transport path, wherein
  the treatment-space gas is produced by mixing a gas containing oxygen and/or water with an inert gas serving as a principal component,
  a shielding body for forming a gas circulation resistance bottleneck between the shielding body and each edge part of the workpiece is provided in the opening of the lamp house,
  the shielding body includes a plate-shaped frame part extending continuously with a periphery of the opening of the lamp house along a transport plane of the workpiece and having an opening with a width allowing for passage of the workpiece, and
  the shielding body causes a pressure in the lamp house to be greater than a pressure in the exhaust space forming member.

2. A light irradiation device configured to emit ultraviolet light to one surface of a band-shaped workpiece transported along a transport path, comprising:
  a lamp house having an opening along a passing plane on a side of the one surface of the workpiece in the transport path;
  an ultraviolet lamp provided in the lamp house so as to extend in a width direction of the workpiece;
  gas supplier configured to supply a treatment-space gas into the lamp house; and an exhaust space forming member having an opening along a passing plane on a side of the other surface of the workpiece in the transport path, wherein the treatment-space gas is produced by mixing a gas containing oxygen and/or water with an inert gas serving as a principal component, and a shielding body for forming a gas circulation resistance bottleneck between the shielding body and each edge part of the workpiece is provided in the opening of the lamp house, the light irradiation device further comprising a plate-shaped frame part extending continuously with a periphery of the opening of the lamp house along a transport plane of the workpiece and having an opening with a width allowing for passage of the workpiece, wherein the shielding body includes a shielding member having a base end part and a leading end part formed continuously in a crank shape, and the shielding member is disposed in such a manner that the base end part is bonded to a lower surface side of the frame part of the lamp house and the leading end part protrudes so as to cover the other surface of each edge part of the workpiece in a width direction thereof, without being in contact therewith.

3. A light irradiation device configured to emit ultraviolet light to one surface of a band-shaped workpiece transported along a transport path, comprising:

a lamp house having an opening along a passing plane on a side of the one surface of the workpiece in the transport path;

an ultraviolet lamp provided in the lamp house so as to extend in a width direction of the workpiece;

gas supplier configured to supply a treatment-space gas into the lamp house; and an exhaust space forming member having an opening along a passing plane on a side of the other surface of the workpiece in the transport path, wherein the treatment-space gas is produced by mixing a gas containing oxygen and/or water with an inert gas serving as a principal component, and a shielding body for forming a gas circulation resistance bottleneck between the shielding body and each edge part of the workpiece is provided in the opening of the lamp house, the light irradiation device further comprising a plate-shaped frame part extending continuously with a periphery of the opening of the lamp house along a transport plane of the workpiece and having an opening with a width allowing for passage of the workpiece, wherein the shielding body includes a plate-shaped shielding member, and the shielding member is disposed so as to cover a lower surface of each edge part of the frame part of the lamp house extending in the transport direction of the workpiece and the other surface of each edge part of the workpiece in a width direction thereof, without being in contact therewith.

4. A light irradiation device configured to emit ultraviolet light to one surface of a band-shaped workpiece transported along a transport path, comprising:

a lamp house having an opening along a passing plane on a side of the one surface of the workpiece in the transport path;

an ultraviolet lamp provided in the lamp house so as to extend in a width direction of the workpiece;

gas supplier configured to supply a treatment-space gas into the lamp house; and an exhaust space forming member having an opening along a passing plane on a side of the other surface of the workpiece in the transport path, wherein the treatment-space gas is produced by mixing a gas containing oxygen and/or water with an inert gas serving as a principal component, a shielding body for forming a gas circulation resistance bottleneck between the shielding body and each edge part of the workpiece is provided in the opening of the lamp house, and the shielding body includes a plate-shaped frame part extending continuously with a periphery of the opening of the lamp house along a parallel plane at a level position more on the side of the other surface of the workpiece than a transport plane of the workpiece, and an edge part of the frame part extending in the transport direction of the workpiece protrudes so as to cover the other surface of each edge part of the workpiece in a width direction thereof, without being in contact therewith.

5. A light irradiation device configured to emit ultraviolet light to one surface of a band-shaped workpiece transported along a transport path, comprising:

a lamp house having an opening along a passing plane on a side of the one surface of the workpiece in the transport path;

an ultraviolet lamp provided in the lamp house so as to extend in a width direction of the workpiece;

gas supplier configured to supply a treatment-space gas into the lamp house; and an exhaust space forming member having an opening along a passing plane on a side of the other surface of the workpiece in the transport path, wherein the treatment-space gas is produced by mixing a gas containing oxygen and/or water with an inert gas serving as a principal component, and a shielding body for forming a gas circulation resistance bottleneck between the shielding body and each edge part of the workpiece is provided in the opening of the lamp house, the light irradiation device further comprising a plate-shaped frame part extending continuously with a periphery of the opening of the lamp house along a transport plane of the workpiece and having an opening with a width allowing for passage of the workpiece, wherein the shielding body includes a plate-shaped shielding member, and the shielding member is disposed so as to cover a lower surface of each edge part of the frame part of the lamp house extending in the transport direction of the workpiece and the entire other surface of the workpiece, without being in contact therewith.

6. The light irradiation device according to claim 1, wherein the shielding body is provided so that each edge part of the shielding body extending in the transport direction of the workpiece can change a position thereof in the width direction of the workpiece.

* * * * *